US006943627B2

(12) United States Patent
Leyonhjelm et al.

(10) Patent No.: US 6,943,627 B2
(45) Date of Patent: Sep. 13, 2005

(54) CALIBRATION OF AN ADAPTIVE SIGNAL CONDITIONING SYSTEM

(75) Inventors: Scott Leyonhjelm, Sundbyberg (SE); Vimar Björk, Göteborg (SE); John Grass, Swindon (GB); Lennart Neovius, Grillby (SE); Paul Leather, Laroque-des-Albères (FR)

(73) Assignee: Telefonaktiebolaget Lm Ericsson (publ), Stockholm (SE)

( * ) Notice: Subject to any disclaimer, the term of this patent is extended or adjusted under 35 U.S.C. 154(b) by 0 days.

(21) Appl. No.: 10/487,873

(22) PCT Filed: Aug. 9, 2002

(86) PCT No.: PCT/SE02/01440

§ 371 (c)(1), (2), (4) Date: Feb. 26, 2004

(87) PCT Pub. No.: WO03/019773

PCT Pub. Date: Mar. 6, 2003

(65) Prior Publication Data

US 2004/0246048 A1 Dec. 9, 2004

(30) Foreign Application Priority Data

Aug. 28, 2001 (SE) ............................................. 0102885

(51) Int. Cl.[7] ................................................. H03F 1/26

(52) U.S. Cl. ....................... 330/149; 327/560; 327/590; 330/51; 330/52

(58) Field of Search ............................. 330/149, 2, 51, 330/150, 52; 331/10; 327/560, 590

(56) References Cited

U.S. PATENT DOCUMENTS 5,396,189 A 3/1995 Hays
5,574,992 A 11/1996 Cygan et al.
5,770,971 A 6/1998 McNicol
5,937,011 A 8/1999 Carney et al.
6,700,447 B1 * 3/2004 Nilsson ....................... 331/10

FOREIGN PATENT DOCUMENTS

EP 0 598 585 A2 5/1994
WO 01/08294 A1 2/2001

OTHER PUBLICATIONS

International Search Report mailed Nov. 19, 2002 in corresponding PCT application No. PCT/SE02/01440.

* cited by examiner

*Primary Examiner*—Michael B Shingleton
(74) *Attorney, Agent, or Firm*—Nixon & Vanderhye, P.C.

(57) ABSTRACT

The invention provides robust and non-invasive calibration of an adaptive signal conditioning system having a signal conditioning block in the signal path to a signal conversion system, and a feedback path with a number of feedback components for enabling adaptation, by means of a parameter adaptation block, of the parameters used in the signal conditioning. In order to calibrate the feedback path, a well-defined reference signal is inserted into the feedback path, and an appropriate calibration coefficient is then determined by a coefficient calibrator in response to the received reference signal. The calibration coefficient is provided to a compensator, which effectively compensates for changes in the transfer characteristics of the feedback path due to factors such as variations in ambient temperature and component aging. Accordingly, the feedback signal transferred over the calibrated feedback path will be an accurate representation of the output signal of the signal conversion system, thus allowing accurate adaptive signal conditioning.

38 Claims, 11 Drawing Sheets

CALIBRATION OF AN ADAPTIVE SIGNAL CONDITIONING SYSTEM

This application is the U.S. national phase of international application PCT/SE02/01440 filled in English 09 Aug. 2002, which designated the U.S. PCT/02/01440 claims priority to SE Application No. 0102885-1, filed 28 Aug. 2001. The entire contents of these applications are incorporated herein by reference.

TECHNICAL FIELD OF THE INVENTION

The present invention generally relates to an adaptive signal conditioning system and a method for calibration of such a system, as well as the implementation of adaptive signal conditioning techniques in a power amplifier system and a multi-branch transmitter system.

BACKGROUND OF THE INVENTION

Adaptive signal conditioning systems can be found in all areas of electronics and communication, and are generally used for adaptively conditioning the input signal to a signal conversion system such as an amplifier chain or any other suitable system in order to continuously provide a desired output signal of the overall system.

Predistortion is a signal conditioning technique, which is used in connection with for example power amplifier and transmitter systems, as described in references [1–9]. The main objective of predistortion is to compensate for distortion caused by the power amplifier or similar system by predistorting the input signal to the power amplifier with the "inverse" of the distortion characteristics of the power amplifier. Ideally, the cascaded response of the inverse predistortion function and the transfer function of the power amplifier results in an overall linear gain and phase transfer function. Typically, the inverse or complementary predistortion function is based on the approximation of the amplifier being modeled by a power series and characterized by its AM-AM (AM, Amplitude Modulation) and AM-PM (PM, Phase Modulation) characteristics. The inverse predistortion function may also include higher-order effects such as thermal properties of the power transistor and/or frequency-dependent properties due to the bias and matching circuitry. However, since the distortion caused by the power amplifier may change over time due to factors such as variations in ambient temperature and component aging, an adaptive predistortion scheme is employed to maintain the linearity. In general, an adaptive predistortion scheme requires a feedback from the output of the power amplifier and an associated adaptation control unit to keep track of changes in the transfer characteristics of the power amplifier and to adapt the predistortion function in response thereto.

FIG. 1 is a schematic block diagram illustrating a typical adaptive digital predistortion system applied in connection with a power amplifier. The input signal $S_{IN}$ is provided to a signal-conditioning block 110. The input signal is here assumed to be a digital signal, which has been subjected to conventional baseband processing. The signal conditioning block 110 implements a predistortion function and modifies the baseband data signal according to the predistortion function. The resulting predistorted signal is then converted into the analog domain in a digital-to-analog converter (DAC) 120 and up-converted to the radio frequency band in a frequency up-converter 130. Finally, the up-converted signal is amplified by the power amplifier (PA) 140 into an output signal $S_{OUT}$, which is transmitted through an antenna 150.

The series connection of the digital-to-analog converter 120, the frequency up-converter 130 and the power amplifier 140 in the signal path after the signal conditioning block 110 is generally regarded as a signal conversion system. The predistortion function implemented in the signal conditioning block 110 generally represents the inverse of the distortion characteristics of the complete signal conversion system or appropriate parts thereof. In most cases, the power amplifier 150 stands for the dominant part of the distortion characteristics, and therefore the predistortion function is often provided as the inverse of the power amplifier distortion characteristics.

In order to enable adaptation of the predistortion function, a feedback path is arranged for providing an observed signal $S_{OBS}$ in response to the output signal $S_{OUT}$ of the power amplifier. The feedback path comprises a probe 160 for probing the power amplifier output, a frequency down-converter 170 and an analog-to-digital-converter (ADC) 180. The observed feedback signal $S_{OBS}$ is provided to a parameter adaptation unit 190, which adapts the parameters of the predistortion function based on the observed signal $S_{OBS}$ and a delayed version, using delay block 195, of the input signal $S_{IN}$.

As long as the observed signal $S_{OBS}$ is an accurate representation of the output signal $S_{OUT}$, the parameter adaptation will maintain an accurate and linear response of the forward transmission path. In practice, however, the transfer characteristics of the feedback path changes dynamically due to variations in temperature and frequency such that the observed signal $S_{OBS}$ at the output of the feedback path no longer is an accurate representation of the output signal $S_{OUT}$. This may severely affect the overall performance of the adaptive predistortion technique. In fact, dynamic changes in the transfer characteristics of the feedback path is a key problem affecting the very core of any adaptive signal conditioning system.

For example, this problem manifests itself with respect to the need to maintain a specified signal level at the output of the power amplifier or similar signal conversion system. With reference once again to FIG. 1, it can be appreciated that the output signal $S_{OUT}$ is related to the input signal $S_{IN}$ and the transmission gain $G_{TX}$ in the following way:

$$S_{OUT}=S_{IN}\cdot G_{TX} \quad (1)$$

Accordingly, it can be seen that the requirement of maintaining a specified output level can alternatively be expressed as maintaining a constant transmission gain $G_{TX}$.

As pointed out above, the adaptive predistortion technique relies on the feedback path for providing an observed signal $S_{OBS}$ in response to the output signal $S_{OUT}$, as well as the parameter adaptation in which the observed signal $S_{OBS}$ is compared to the delayed version of the input signal $S_{IN}$ with the goal of making $S_{OBS}$ equal to $S_{IN}$. In practice, the feedback path has a gain $G_{RX}$, and the relation between the observed signal $S_{OBS}$ and the output signal $S_{OUT}$ can be expressed as:

$$S_{OBS}=S_{OUT}\cdot G_{RX} \quad (2)$$

By combining expressions (1) and (2), the following relation between the observed signal $S_{OBS}$ and the input signal $S_{IN}$ is obtained:

$$S_{OBS}=G_{RX}\cdot G_{TX}\cdot S_{IN} \quad (3)$$

Since the goal of the parameter adaptation is to make $S_{OBS}$ equal to $S_{IN}$, the parameter adaptation with respect to gain is working properly as long as the following holds true:

$$G_{RX}\cdot G_{TX}=1 \quad (4)$$

The output signal $S_{OUT}$ is maintained at a specified level as long as both $G_{RX}$ and $G_{TX}$ do not change. However, in practice, both $G_{RX}$ and $G_{TX}$ change due to factors such as temperature variations and component aging. The gain factors $G_{RX}$ and $G_{TX}$ could possibly change in such a way that $G_{RX} \cdot G_{TX}=1$. While this would not influence the predistortion parameter adaptation, it would result in an incorrect output signal since the altered transmission gain $G_{TX}=(G_{TXinitial}+G_{TXchange})$ will be incorrect. Naturally, the gain factors $G_{RX}$ and $G_{TX}$ may change in such a way that $G_{RX} \cdot G_{TX}$ does not equal 1. This also results in an incorrect output signal $S_{OUT}$.

In most applications, the system requirements on output power accuracy make it necessary to control the output signal level. Radio transmitters for example typically have requirements that the output signal level should be accurate within the range of +/−0.5 to +/−3.0 dB. The accuracy is especially important in CDMA systems where the output power of a base station or a terminal has to be controlled very accurately in order not to sacrifice system capacity. Due to radio transmitters being subject to high variations in ambient temperature and then including other effects such as aging, transmission frequency changes and power supply variations, there is a need to correct the gain variations of $G_{RX}$ and $G_{TX}$.

With adaptive predistortion, the problem is generally simplified to keeping either $G_{RX}$ or $G_{TX}$ constant as the parameter adaptation is capable of keeping the other gain factor constant. However, if both $G_{RX}$ and $G_{TX}$ change, additional information and a corresponding adaptation process are required to correct for the second gain variation.

In this respect, a straightforward technique is to fully characterize either the transmission path or the feedback path over known variables such as temperature and transmission frequency at manufacture and then compensate for the gain variations by means of a gain-compensating device. It is known to use look-up tables that are addressed during operation to provide the required correction coefficients to the gain-compensating device. Another option is simply to select a suitable passive attenuator to compensate for the gain variations.

Pre-characterization however has the disadvantage that there is some uncertainty whether the gain compensation will remain accurate with the aging of the many components involved. Another disadvantage is the time required during production to complete the characterization and/or to calculate the compensation coefficients.

A more advanced technique, used in the commercially available radio base station RBS 1107/1127 from Ericsson, involves a transmission power tracking loop that maintains the gain of the transmission path based on actual measurements of the output power of the power amplifier and the input power to the adaptive predistortion system using dedicated power detectors. In this way, since the transmission path is gain calibrated, the parameter adaptation is capable of keeping the gain of the feedback path constant. However, the power detectors must still be calibrated over all known relevant variables such as power, temperature and frequency. Although the power detector components are relatively few compared to the complete transmission path, this represents tile same disadvantage as mentioned earlier, including uncertainty with aging and the time required in production.

SUMMARY OF THE INVENTION

The present invention overcomes these and other drawbacks of the prior art arrangements.

It is a general object of the present invention to provide an improved adaptive signal conditioning system.

It is another object of the invention to provide a mechanism for robust and efficient calibration of an adaptive signal conditioning system.

Yet another object of the invention is to provide a power amplifier system as well as a multi-branch transmitter system such as an adaptive antenna system or a transmit diversity system in which a robustly calibrated adaptive signal conditioning system is implemented.

These and other objects are met by the invention as defined by the accompanying patent claims.

The general idea according to the invention is to provide robust and efficient calibration of an adaptive signal conditioning system by selectively inserting a well-defined reference signal into the feedback path, and calibrating the feedback path based on the reference signal. The use of a reference signal for calibration of the feedback path means that the effects of changes in the transfer characteristics of the feedback path due to factors such as variations in ambient temperature and component aging are effectively removed. In this way, the feedback signal transferred over the calibrated feedback path will be an accurate representation of the output signal of the forward path, thus allowing accurate adaptive signal conditioning.

The feedback path may be calibrated with respect to any signal-affecting property such as the gain, phase shift or delay of the feedback path based on measurements of changes in the corresponding signal characteristics of the reference signal over the feedback path.

By using a predefined and stable reference signal, the nominal signal characteristics of the inserted reference signal is generally known. Accordingly, any changes in the transfer characteristics of the feedback path may typically be revealed by a simple comparison of the reference signal characteristics measured at the output of the feedback path and the known signal characteristics.

In order to ensure that the predefined nominal signal characteristics of the reference signal is maintained over time, direct measurements or pre-characterization of the reference signal characteristics over variables such as temperature and frequency is utilized in preferred embodiments of the invention.

The invention is generally applicable and may be implemented with any system that requires accurate adaptive signal conditioning. For example, the invention may be implemented with a power amplifier system for maintaining an absolutely accurate and linear output response. In this regard, it may be of particular interest to maintain the output power accuracy of the power amplifier system by calibrating the feedback path of the adaptive signal conditioning system with respect to gain. Another important example involves a multi-branch transmitter system, such as an adaptive antenna system or a transit diversity system, in which the invention is implemented for accurately controlling the gain, phase and/or delay. In an adaptive antenna system, the calibration according to the invention can be used for providing accurate gain and phase control. In a transmit diversity system, the invention can be used for accurate delay matching between different transmission branches.

The invention offers the following advantages:

Robust and efficient calibration;

Non-invasive calibration, since the calibration does not interrupt the normal operation of the forward path of the overall system;

Automatic calibration during operation;

Reduced need for costly calibration procedures during production;

Absolute power accuracy in a power amplifier system;

Accurate gain and phase control in an adaptive antenna system; and

Accurate delay matching in a transmit diversity system.

Other advantages offered by the present invention will be appreciated upon reading of the below description of the embodiments of the invention.

BRIEF DESCRIPTION OF THE DRAWINGS

The invention, together with further objects and advantages thereof, will be best understood by reference to the following description taken together with the accompanying drawings, in which.

DETAILED DESCRIPTION OF EMBODIMENTS OF THE INVENTION

Calibration of a General Adaptive Signal Conditioning System

Figure 1:
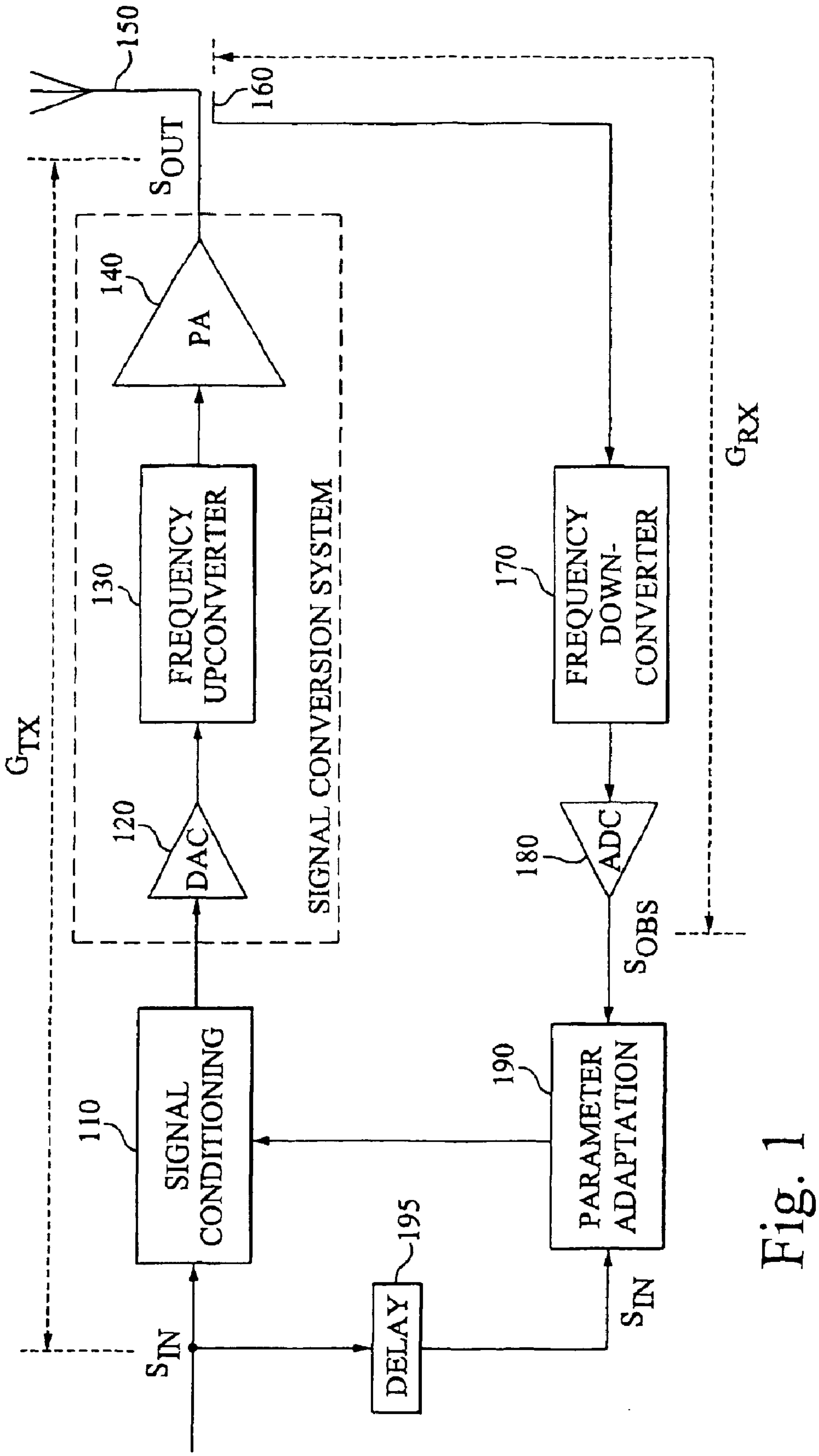
FIG. 1 is a schematic block diagram illustrating a typical adaptive predistortion system applied in connection with a power amplifier.
Figure 2:
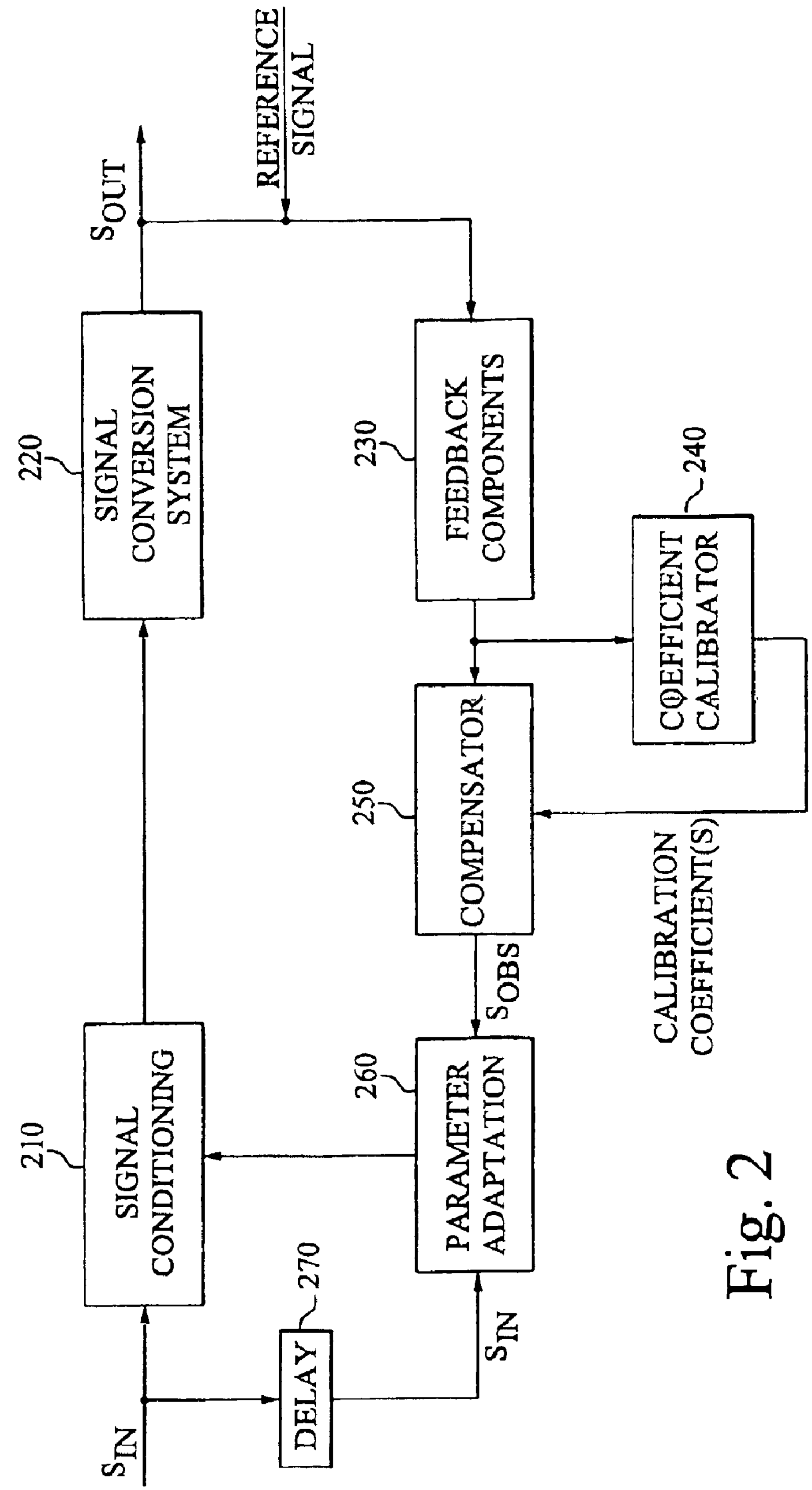
FIG. 2 is a schematic block diagram illustrating a general adaptive signal conditioning system according to the invention, applied in connection with an arbitrary signal conversion system.

FIG. 2 is a schematic block diagram illustrating a general adaptive signal conditioning system according to the invention, applied in connection with an arbitrary signal conversion system. A signal conditioning block 210 is provided in the input signal path to a signal conversion system 220 for preconditioning the signal to be converted by the signal conversion system 220. In other words, the signal conditioning block 210 receives an input signal $S_{IN}$ and modifies the input signal according to the particular application. The resulting modified signal is then transferred to the signal conversion system 220, which converts the modified input signal into an output signal $S_{OUT}$. The signal conversion system 220 may be any signal conversion system known to the art, performing signal conversion such as amplification, attenuation, frequency conversion, phase shifting or any other filtering that affects the signal characteristics of the preconditioned input signal.

In order to enable adaptation of the signal conditioning performed by the signal conditioning block 210, a feedback path is arranged for providing an observed signal $S_{OBS}$ in response to the output signal $S_{OUT}$ of the signal conversion system 220. Typically, the feedback path comprises one or more operatively active feedback components 230 for normalizing the feedback signal to the same general format (analog/digital, the sane frequency domain, etc.) as the input signal $S_{IN}$ to provide an appropriate representation of the output signal $S_{OUT}$ that can be compared to the input signal $S_{IN}$ during adaptation of the parameters used in the signal conditioning. However, the signal transfer characteristics of the feedback components 230 generally change dynamically due to for example component aging and variations in temperature and frequency, thus negatively affecting the very core of the adaptive signal conditioning technique.

In accordance with the invention, the detrimental effects of these dynamic changes in transfer characteristics are effectively eliminated by selectively inserting a reference signal into the feedback path and calibrating the feedback path based on the reference signal. It has been recognized that changes in the transfer characteristics of the feedback path can be determined by detecting changes in the signal characteristics of the reference signal over the feedback path. For this purpose, a coefficient calibrator 240 is preferably arranged to receive the reference signal as the reference signal has been transferred through the feedback components 230 and determine the changes in signal characteristics of the reference signal from the insertion point. In a straight forward application, this may be accomplished by a simple comparison of the signal characteristics measured by the coefficient calibrator 240 and the known nominal signal characteristics of the inserted reference signal. The calibrator 240 then calculates one or more calibration coefficients based on the determined changes in reference signal characteristics. The calculated calibration coefficient or coefficients are sent to a feedback compensator 250 that effectively compensates for, in the feedback signal, the changes in transfer characteristics of the feedback components.

Finally, the compensated observed signal $S_{OBS}$ is provided to a parameter adaptation block 260 together with a delayed version of the input signal $S_{IN}$. The input signal $S_{IN}$ is delayed using delay block 270 to compensate for the delay introduced by the feedback path. The parameter adaptation block 260 then adapts the parameters used by the signal conditioning block 210 based on the observed signal $S_{OBS}$ and the delayed input signal $S_{IN}$.

By virtue of the calibration procedure according to the invention, the observed signal $S_{OBS}$ will be a much more accurate representation of the output signal of the signal conversion system since the feedback path has been stabilized by the calibration. In order to maintain a stabilized feedback path, the calibration procedure is preferably repeated at selected times, or when needed as indicated by environmental or operational parameters. A calibrated feedback path that provides an accurate output signal representation is particularly important for adaptive signal conditioning in high-performance applications.

It should be understood that the feedback path may be calibrated with respect to any signal-affecting property such as the gain, phase shift or delay of the feedback path based on measurements of changes in the corresponding signal characteristics of the reference signal over the feedback path. This naturally means at the implementation of the coefficient calibrator 240 and the compensator 250 has to be adapted to the particular application. For example, the calibrator 240 may be provided with a signal level detector for gain calibration, a phase detector for phase calibration or a delay detector for delay calibration. The compensator 250 could be a simple multiplier for gain correction, a phase adjuster for phase correction, a complex multiplier for phase and gain correction, a delay filter (also referred to as a time shift filter) for delay correction, or even a complex filter for handling phase and gain variations that are frequency-dependent.

The reference signal could be a simple sinewave signal, a more complex signal such as a CDMA or multitone signal, or any other signal whose properties allow the characteristics of at least one of gain, phase and delay to be determined. The reference signal does not necessarily have to be a continuous signal, but could be provided in the form of a pulsed signal. The use of a pulsed reference signal has turned out to be particularly useful for delay calibration. In addition, the reference signal is preferably customized for the particular application in question, and may be adapted to operational parameters such as transmission frequency or adapted to the characteristics of the feedback component or components used in the feedback path.

If the reference signal is inserted directly onto the normal operational feedback signal to form a composite (feedback and reference) signal, the calibrator 240 is adapted to extract the reference signal part of the composite signal for use in the calibration. Normally, this also means that compensator 250 cancels the reference signal part of the composite signal to provide an accurate observed signal to the parameter adaptation block 260. In other words, the compensator 250 not only compensates for changes in feedback transfer characteristics but also cancels the reference signal from the composite (feedback and reference) signal.

Although the coefficient calibrator 240 and the compensator 250 are normally regarded as part of the calibrated feedback path, it should be understood that the calibrator 240 as well as the compensator 250 may be embedded, logically and/or physically, in the parameter adaptation block 260.

Alternatively, however, switches are used for selectively switching the reference signal into the feedback path instead of the output signal of the signal conversion system, and for selectively switching the reference signal to the calibrator as will be described below with reference to the block diagram of FIG. 3.

Figure 3:
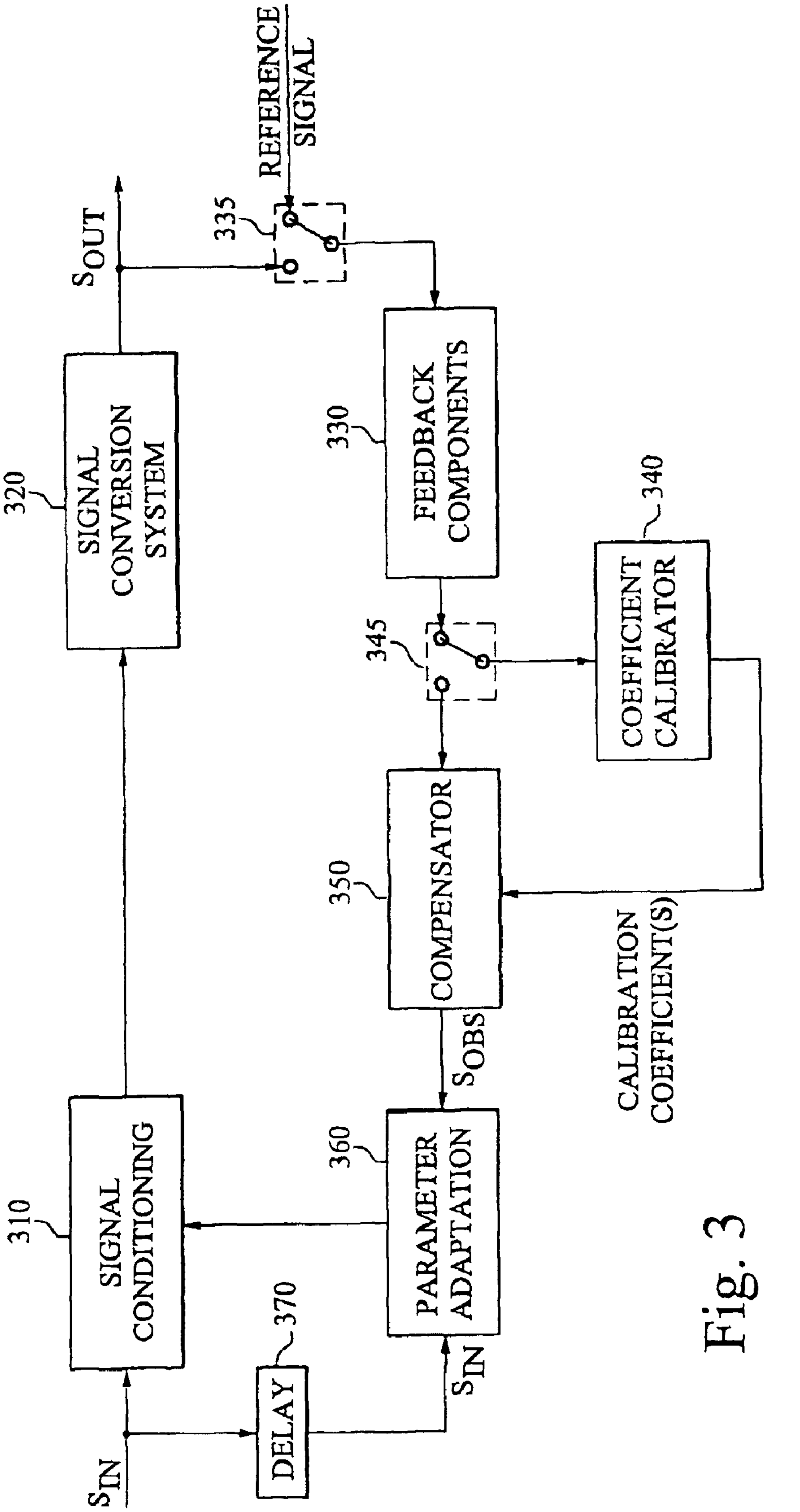
FIG. 3 is a schematic block diagram illustrating an adaptive signal conditioning system with switch-based insertion of the reference signal.

FIG. 3 is a schematic block diagram illustrating an adaptive signal conditioning system with switch-based insertion of the reference signal. The block diagram of FIG. 3 is similar to that of FIG. 2, except for two switches 335 and 345 in the feedback path. The first switch 335 receives the output signal of the signal conversion system 320 as well as the reference signal for selectively forwarding either the output signal of the signal conversion system or the reference signal in the feedback path. The second switch 345 receives the output signal of the feedback components 330 for selectively forwarding that signal either to the coefficient calibrator 340 or the compensator 350.

During calibration, the reference signal is switched into the feedback path by the first switch 335, and switched to the calibrator by the second switch 345. In this way, the reference signal is allowed to pass through the feedback components 330 and to the calibrator 340 so that the changes in reference signal characteristics from the insertion point can be determined. The calibrator 340 then determines an appropriate calibration coefficient based on the determined changes in reference signal characteristics.

In normal operation, the first switch 335 is operated so that the output signal of the signal conversion system is transferred over the feedback path. Now, the second switch 345 is operated to forward the feedback signal from the feedback components directly to the compensator 350, which then effectuates the calibration.

Figure 4:
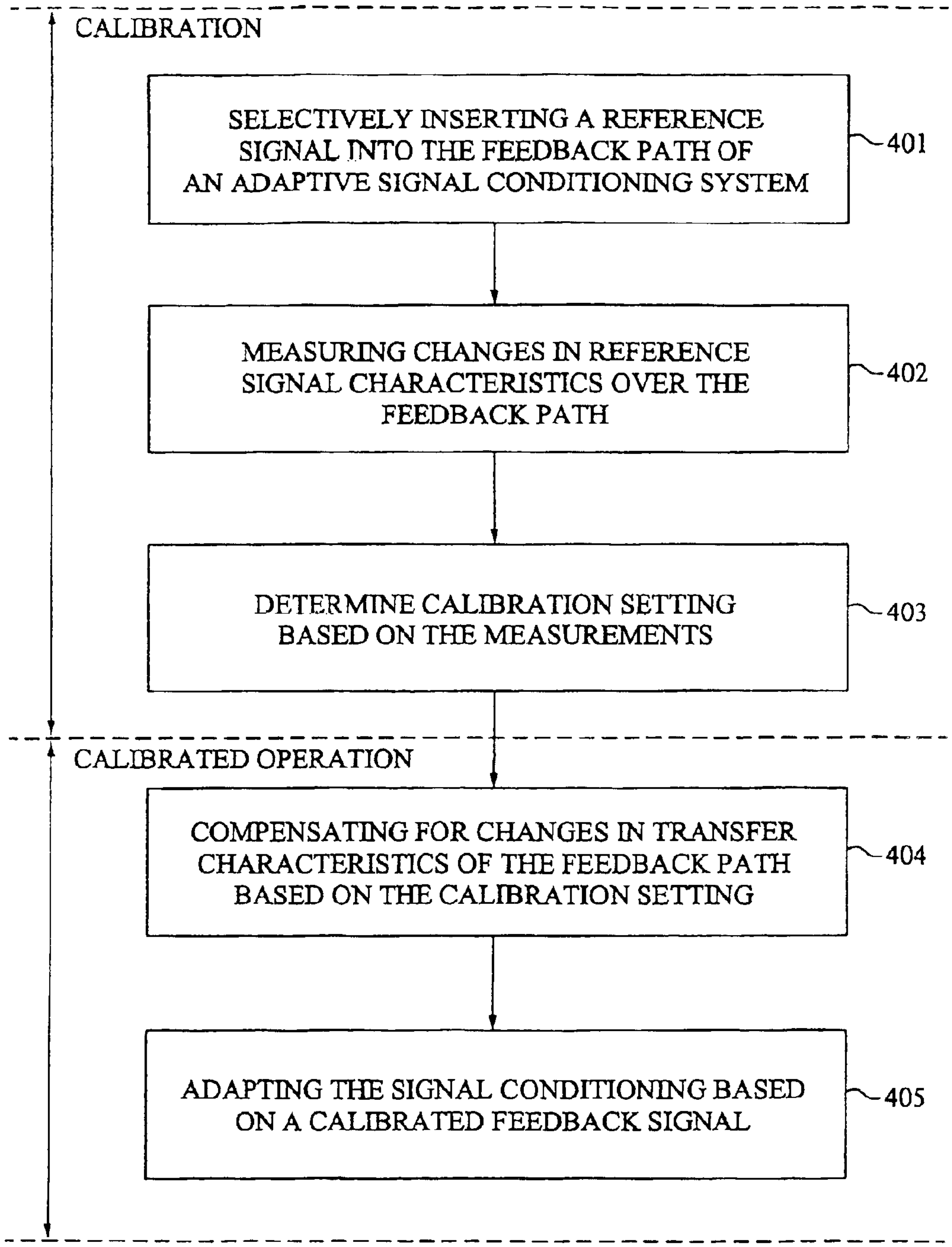
FIG. 4 is a schematic flow diagram of a method for calibrating an adaptive signal conditioning system according to a preferred embodiment of the invention, including calibrated operation of the signal conditioning system.

FIG. 4 is a schematic flow diagram of a method for calibrating an adaptive signal conditioning system according to a preferred embodiment of the invention, including calibrated operation of the signal conditioning system. The method illustrated in FIG. 4 includes a first calibration phase and a second operational phase. The calibration phase is initiated at selected times defined in the overall system, e.g. at regular intervals, by inserting a well-defined reference signal into the feedback path of the adaptive signal conditioning system (step 401). Next, changes in the transfer characteristics of the feedback path are estimated by measuring changes in the signal characteristics of the reference signal over the relevant sections of the feedback path (step 402). Based on these measurements, a calibration setting is determined (step 403) for enabling compensation for changes in the transfer characteristics of the feedback path. In the subsequent phase of calibrated operation, the calibration setting just determined will be used for compensating, in the feedback signal, for changes in feedback transfer characteristics (step 404) until a new, updated calibration setting is determined. Using the calibrated feedback signal in the parameter adaptation of the signal conditioning system, ensures proper and accurate signal conditioning (step 405).

Maintaining the Nominal Signal Characteristics of the Reference Signal

The calibration procedure according to the invention works perfectly well as long as the nominal signal characteristics of the inserted reference signal is maintained over time. If the reference signal itself is not maintained, the accuracy of the overall feedback calibration will drift due to various factors that affect the reference signal generator. In many applications, this is not critical, but in some applications, it may be necessary to calibrate the reference signal. An example of reference signal calibration that can be used with the invention will now be described with reference to FIG. 5.

Figure 5:
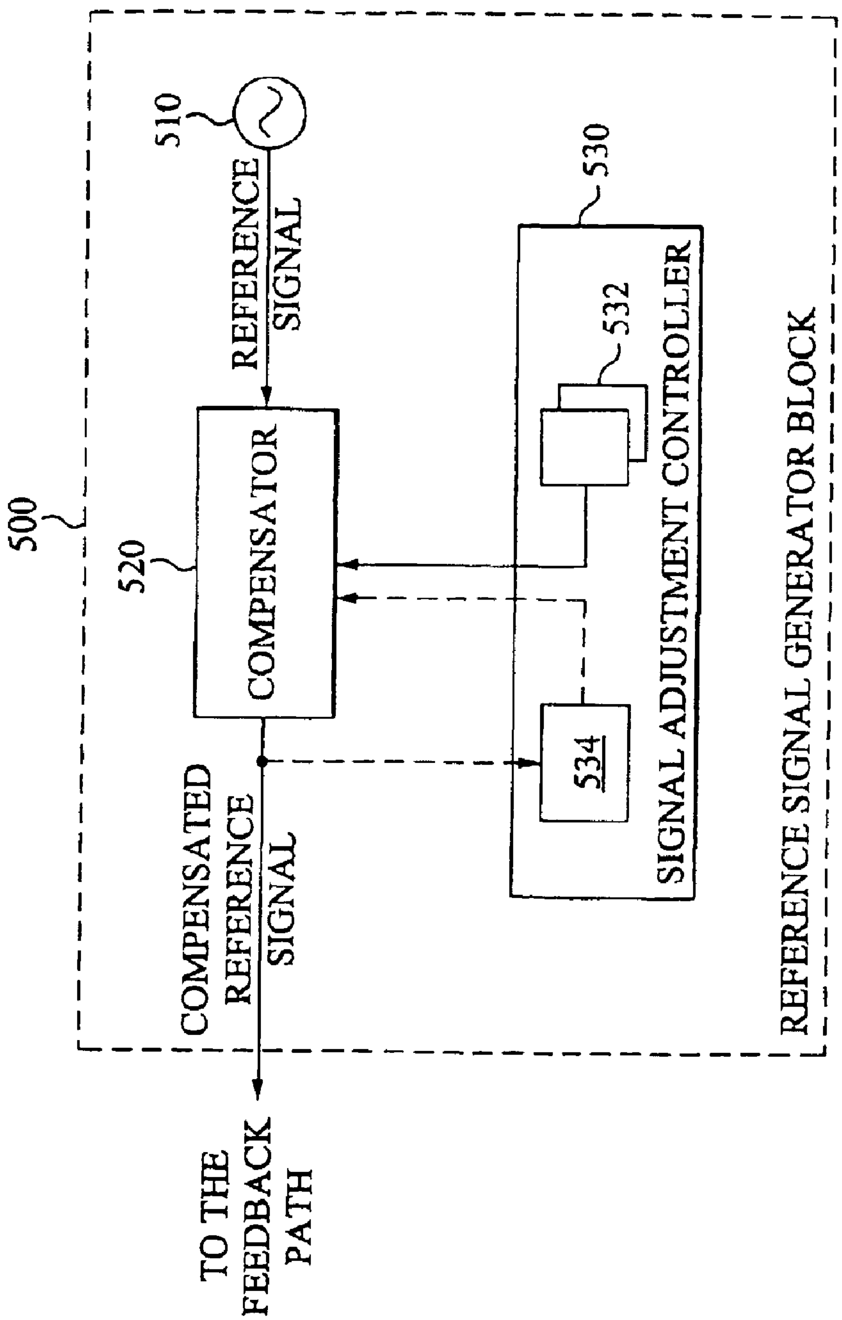
FIG. 5 is a schematic diagram of a reference signal generator block that can be used by the invention for accurately maintaining the nominal reference signal characteristics.

FIG. 5 is a schematic diagram of a reference signal generator block that can be used by all embodiments of the invention for accurately maintaining the nominal reference signal characteristics, for example with respect to signal level, phase and/or delay. The reference signal generator block 500 basically comprises a signal generator 510 such as stable sinewave generator, a compensator 520 and a signal adjustment controller 530. The compensator 520 adjusts the reference signal from the signal generator 510 according to commands from the signal adjustment controller 530 to maintain the nominal signal characteristics of the reference signal. Preferably, the signal adjustment of the compensator 520 is performed based on pre-characterization of the reference signal characteristics with respect variables such as temperature, frequency and time. This can be accomplished by characterizing the variation in reference signal characteristics as being dependent on different variables. In a typical implementation, the signal adjustment controller 530 utilizes look-up tables 532 in which pre-characterized correction coefficients are stored. The look-up tables are addressed during operation such that they supply the required correction coefficients to the compensator 520 to maintain the nominal signal characteristics over time. The compensated reference signal is provided to the feedback path of an adaptive signal conditioning system to enable calibration.

Alternatively, the signal adjustment is performed based on direct measurements of the reference signal characteristics. For example, this may be accomplished by measuring the signal characteristics at the output of the compensator 520 and adjusting the operation of the compensator 520 by means of a calibrator 534.

As mentioned above, the invention is generally -applicable and can be used for calibration of adaptive signal conditioning systems in different applications for various purposes. For example, the invention may be utilized for maintaining accurate and linear output response of a power amplifier system, for accurately controlling the gain and phase in an adaptive antenna system or for minting the desired accuracy of the delay matching between different transmission branches in a transit diversity system all as will be described in more detail below.

Implementation in a Power Amplifier System

Figure 6:
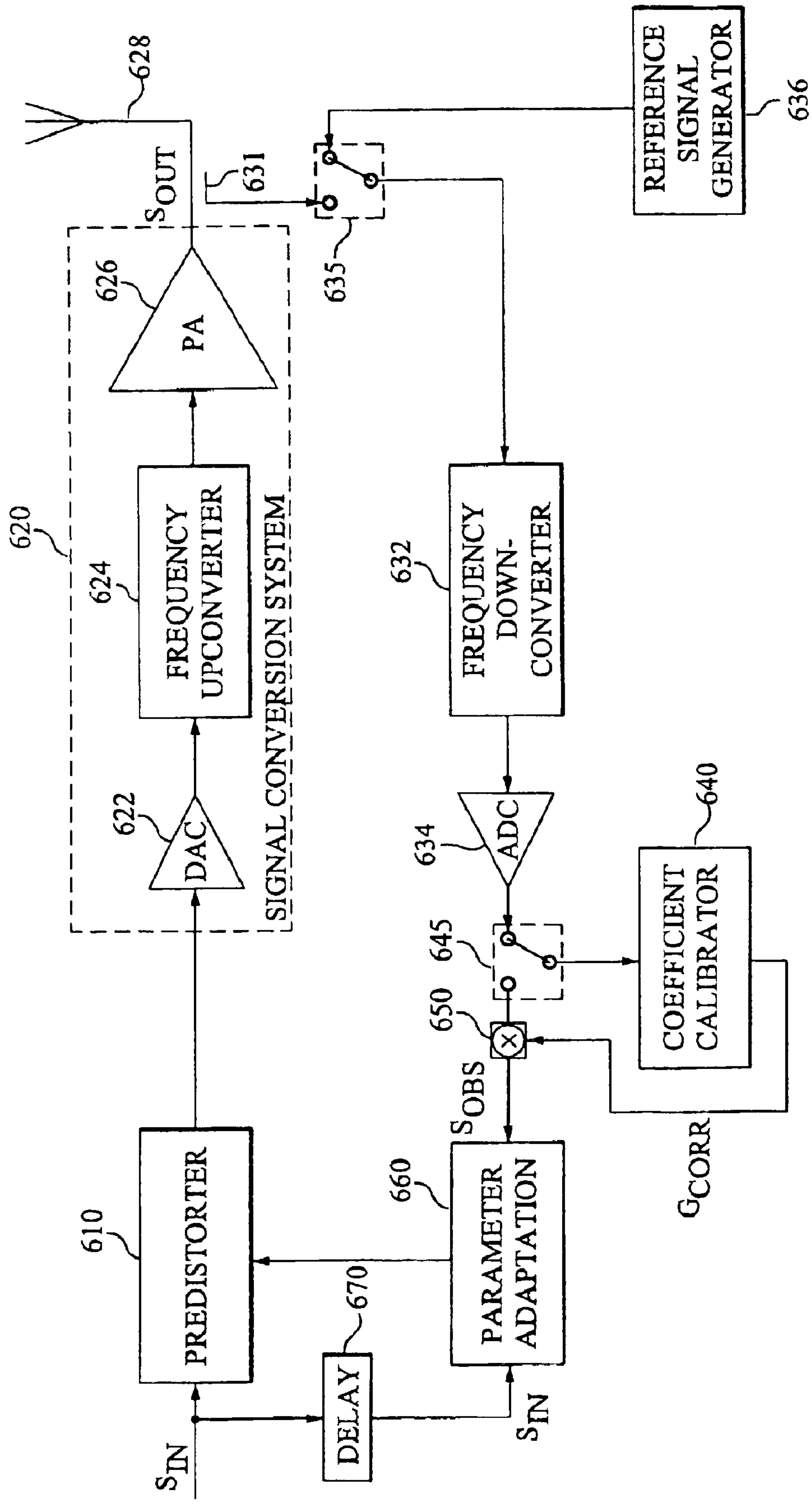
FIG. 6 is a schematic block diagram illustrating an adaptive power amplifier system according to a preferred embodiment of the invention.

FIG. 6 is a schematic block diagram illustrating an adaptive power amplifier system according to a preferred embodiment of the invention. A digital predistorter 610 is arranged in the input signal path to an antenna-feeding signal conversion system 620 for predistorting the input signal $S_{IN}$ in order to compensate for the distortion characteristics of the overall signal conversion system 620 or appropriate parts thereof. In this example, the signal conversion system 620 includes a digital-to-analog converter (DAC) 622, a frequency up-converter 624 and a power amplifier (PA) 626.

The predistortion function implemented in the predistorter 610 typically represents either the inverse (also known as the complementary) of the distortion characteristics of the entire series connection of the DAC 622, the frequency up-converter 624 and the power amplifier 626 or the inverse of the power amplifier distortion characteristics. Preferably, the predistorter is based on conventional Cartesian or polar complex gain predistortion and the predistortion function is implemented by means of a look-up table containing complex gain correction factors. The look-up table is generally addressed based on the signal characteristics, typically the signal amplitude or power level, of the input signal $S_{IN}$. The address generated for a particular sample of the digital input signal $S_{IN}$ is used to select a complementary complex gain from the look-up table, and the selected complex gain is then processed together with the original input sample in a complex multiplier to generate the predistorted signal. Additional general information on the conventional aspects of digital predistortion can be found in the literature, for example in references [10–14].

The resulting predistorted signal is then converted into the analog domain in the DAC 622, and up-converted to the radio frequency band in the frequency up-converter 624. Finally, the unconverted radio signal is amplified by the power amplifier 626 into an output signal $S_{OUT}$, which is transmitted through the antenna 628.

The output signal $S_{OUT}$ of the power amplifier 626 is probed by a high-impedance probe or an RF-coupler 631 and transferred over a feedback path to provide a representation $S_{OBS}$ of the power amplifier output signal that can be compared to the input signal $S_{IN}$ during parameter adaptation. A switch 635 is incorporated in the feedback path for selectively forwarding either the probed output signal of the power amplifier 626 (normal operation) or a predefined reference signal from a reference signal generator 636 (calibration) to a frequency down-converter 632 and a subsequent analog-to-digital converter (ADC) 634. The output of the ADC 634 is connected to a further switch 645, which selectively forwards the digital output signal of the ADC 634 either to a coefficient calibrator 640 or a complex multiplier 650. The complex multiplier 650 is finally connected to a parameter adaptation block 660.

In order to make sure that the observed signal $S_{OBS}$ is an accurate representation of the power amplifier output signal $S_{OUT}$, the feedback path is preferably calibrated at regular intervals defined by the system. During calibration, the reference signal is switched into the feedback path by the switch 635, and transferred through the down-converter 632 and the ADC 634 onto the switch 645, which switches the reference signal to the coefficient calibrator 640. In this way, the reference signal is allowed to pass through the frequency down-converter 632 and ADC 634 to the calibrator 640. This means that changes in signal level and phase of the reference signal from the insertion point at the switch 635 to the calibrator 640 can be determined by the calibrator 640. For this purpose, the calibrator 640 is provided with a signal level detector and a phase detector and also holds information on the nominal phase and signal level of the reference signal from the reference signal generator 636. The calibrator 640 then determines a complex gain coefficient $G_{CORR}$ based on the detected changes in signal level and phase of the reference signal, and forwards the calibration coefficient to the complex multiplier 650.

In normal operation, assuming that the complex calibration coefficient has been determined, the switch 635 is operated so that the probed output signal of the power amplifier is transferred over the feedback path. The frequency-down converter 632 and the ADC 634 makes sure that the probed analog output signal $S_{OUT}$ is converted into a digital signal of the same frequency as the original input signal $S_{IN}$. Now, the switch 645 is operated to provide a direct path between the ADC 634 and the complex multiplier 650. The complex multiplier 650 effectuates the calibration by processing the frequency down-converted digital feedback signal and the complex calibration coefficient to provide a calibrated observed signal $S_{OBS}$.

The calibrated observed signal $S_{OBS}$ is then provided to the parameter adaptation block 660, which adapts the predistortion function by updating the look-up table entries of the predistorter 610 based on an analysis of the calibrated observed signal $S_{OBS}$ and a delayed version, using delay block 670, of the input signal $S_{IN}$.

Although the predistorter has been described as a digital predistorter operating at baseband, it should be understood that the predistortion can be applied at radio or intermediate frequencies, known as analog predistortion.

If the phase shift of the feedback path is already maintained or not required to be maintained, it may be sufficient to calibrate the feedback path with respect to gain only to maintain the output power accuracy of the power amplifier system. In this case, the calibrator 640 is provided with an amplitude level detector for measuring the reference signal amplitude/level. The calibrator 640 determines a gain correction coefficient based on the measured signal level and the nominal signal level of the reference signal. The signal compensation or calibration can now be accomplished by combining the normal feedback signal and the correction coefficient in a simple multiplier (no need for a complex multiplier). In this way, the calibration procedure according to the invention keeps the gain $G_{RX}$ of the feedback path constant, while the parameter adaptation of the adaptive predistortion technique is capable of keeping the transmission gain $G_{TX}$ constant. This means that an absolute output power accuracy is obtained.

Figure 7:
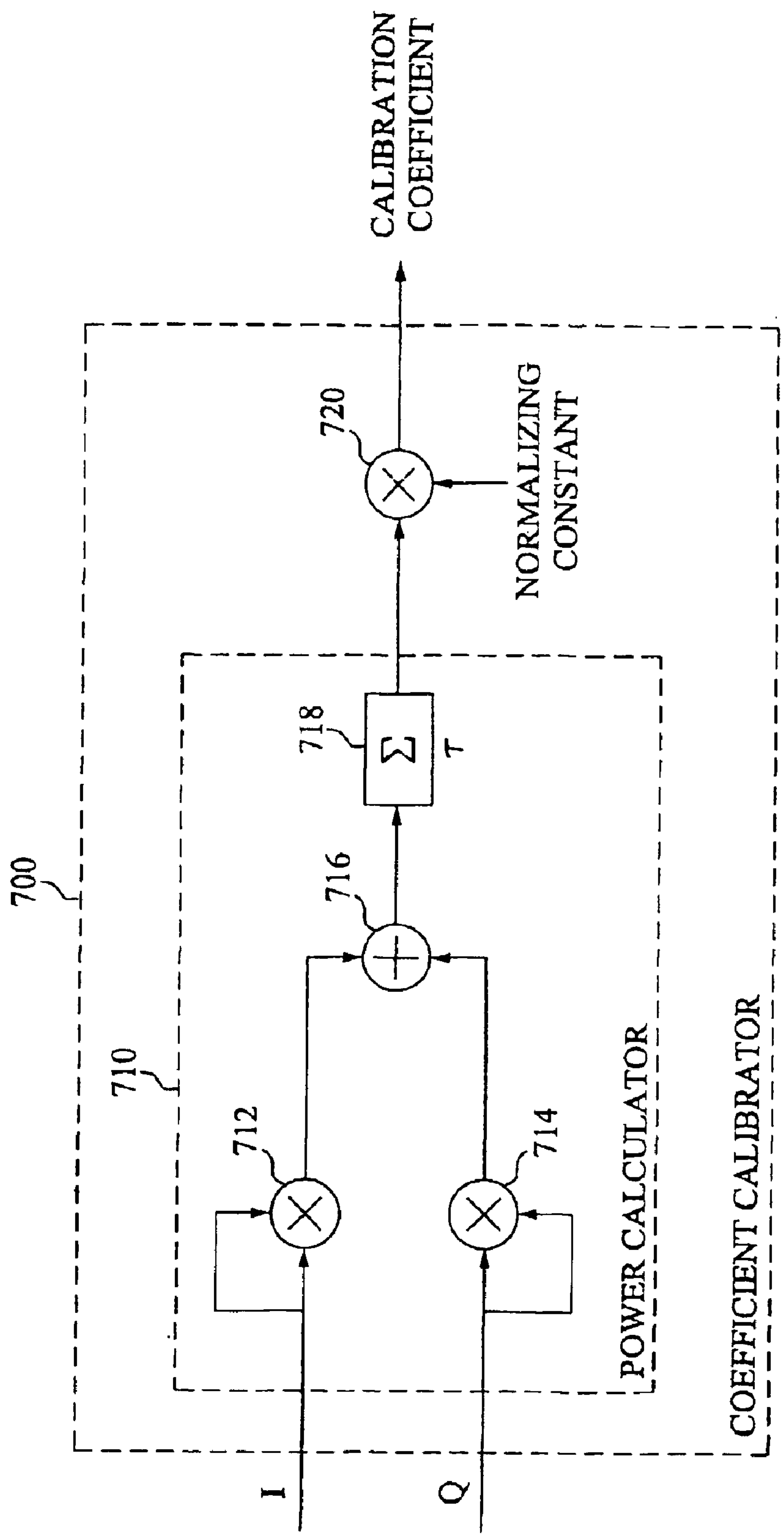
FIG. 7 illustrates an example of a coefficient calibrator for gain calibration of the feedback path of an adaptive signal conditioning system.

FIG. 7 illustrates an example of a coefficient calibrator for gain calibration of the feedback path of an adaptive signal conditioning system for the purpose of maintaining an absolute output power accuracy. The coefficient calibrator 700 basically comprises a power calculator 710 for calculating the signal power level of the reference signal based on the I- and Q-components of the reference signal, and an output multiplier 720 for multiplying the signal power level with a norm constant to produce a calibration coefficient. The power level of the received reference signal is generally calculated by squaring the I- and Q-components using the multipliers 712, 714, summing the squared I- and Q-components in the adder 716 and calculating a mean value of the power level over a given time period in the mean value calculator 718. The resulting signal is then multiplied in the multiplier 720 with the normalizing constant to produce a gain correction coefficient. The normalizing constant takes the nominal reference signal level and the desired gain of the feedback path into account, and would typically be characterized during production. If the reference signal has been converted from analog to digital form over the feedback path, the coefficient calibrator is preferably realized as a completely digital implementation.

A further embodiment is necessary when the feedback path is required to be compensated for gain and phase that are frequency-dependent over the bandwidth of the feedback path. In such a case, the reference signal may be provided in the form of a multitone signal, with a number of tones separated by a fixed frequency offset. These multiple tones must have a known relative gain and phase relationship. Now, the coefficient calculator fist calculates the received gain and phase of each individual tone, for example by transforming the received time domain signal into the frequency domain via a Discrete Fourier Transform (DFT). The gain and phase frequency response of the feedback path is determined and an equalization frequency response is calculated accordingly. The equalization response combined with the feedback path response gives a frequency-independent gain and phase response. In practice, the equalization response is transformed into coefficients to be used in the compensator. Preferably, the compensator is implemented as a Finite Impulse Response (FIR) filter, using a Least Mean Square (LMS) algorithm to calculate the coefficients of the compensating FIR filter from the derived equalization response.

Implementation in an Adaptive Antenna System

Figure 8:
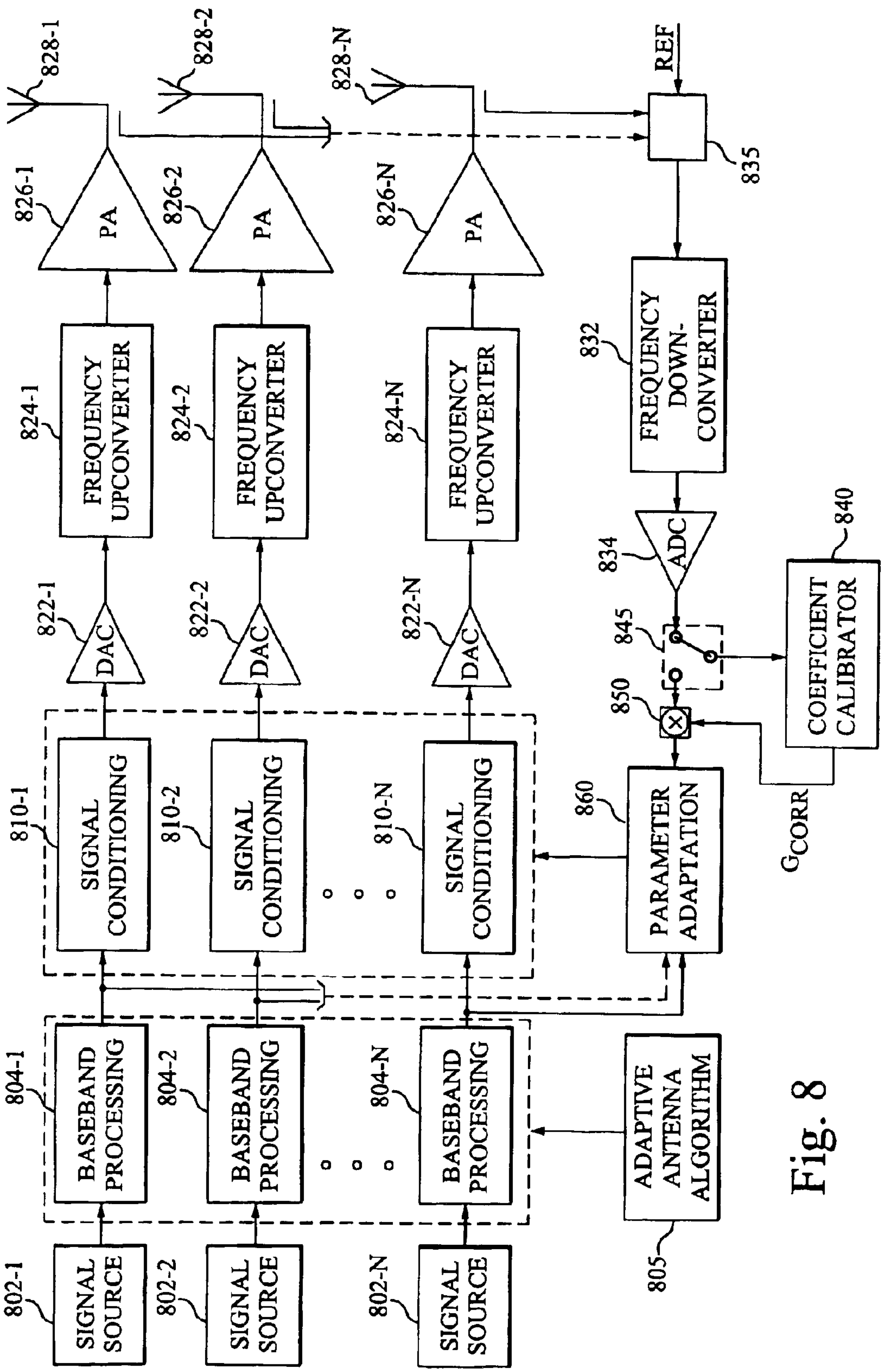
FIG. 8 is a schematic block diagram illustrating an adaptive antenna system according to a preferred embodiment of the invention.

FIG. 8 is a schematic block diagram illustrating an adaptive antenna system according to a preferred embodiment of the invention. The adaptive antenna system of FIG. 8 basically comprises a number, N, of transmission branches. In this example, each transmission branch includes a signal source 802, a baseband processing block 804, a signal conditioning block 810, a digital-to-analog converter 822, a frequency up-converter 824, and a power amplifier 826 connected to an antenna element 828. The antenna elements 828-1 to 828-N form an antenna array. By properly setting the phase and/or amplitude of the transmission signal in each transmission branch using an adaptive antenna algorithm, and simultaneously transmitting the transmission signals from the plurality of antenna elements 828-1 to 828-N, a desired combined radiation pattern can be produced by the antenna array. An adaptive antenna algorithm block 805 typically controls the baseband processing blocks 804-1 to 804-N to provide the desired individual transmission signals.

However, the accuracy of the relative linear gain and/or phase between the different transmission branches may be far from optimized (even if the transmission branches are linearized) due to component aging and variations in temperature and transmission frequency during operation as well as difficulties in properly setting the nominal linear gain and phase shift of the transmission branches at production. This means that an adjustment/calibration of the linear gain and/or phase shift of the different transmission branches often is necessary during operation in order to control the relative linear gain and phase accuracy. To this end, a feedback path is normally required to allow adaptation of the parameters used by the signal conditioning blocks 810-1 to 810-N so that the phase and/or amplitude of the transmission signals can be accurately controlled. In the embodiment of FIG. 8, all the antenna-feeding transmission branches alternately share a common feedback path, with a feedback connection from the output of each power amplifier to a switch arrangement 835 in the feedback path. This means that the switch arrangement 835 alternately connects the different transmission branches to the feedback path for allowing adaptation of the transmission signals in turns.

Unfortunately, the gain and/or phase shift of the feedback path is typically also affected by variations in temperature and frequency, and component aging. Therefore, the invention not only proposes adaptive signal conditioning for accurately controlling the phase and/or amplitude of the transmission signals but also the use of a predefined reference signal for recurrently calibrating the feedback path in order to fulfil the requirements on gain and phase accuracy.

For this purpose, the switch arrangement 835 is adapted to selectively switch a reference signal into the feedback path. In addition, the output of the ADC 834 is connected to a further switch 845, which selectively forwards the digital output signal of the ADC 834 either to a coefficient calibrator 840 or a complex multiplier 850. Preferably, the coefficient calibrator 840 operates in a similar manner as the coefficient calibrator of FIG. 6, providing a complex gain correction coefficient $G_{CORR}$ to the complex multiplier 850. The complex multiplier 850 is connected to a parameter adaptation block 860 for providing a calibrated, accurate representation of the output signal of the respective power amplifier to the adaptation block.

The parameter adaptation block 860 compares the calibrated feedback signal with a delayed version (the delay blocks are not explicitly shown in FIG. 8) of the corresponding input signal, and then adapts the operation of the respective signal conditioning block based on the comparison. The parameter adaptation is primarily performed for adjusting the phase and/or amplitude of the transmission signal of the respective transmission branch, but preferably also for predistorting the respective transmission signal for canceling possible distortion and linearizing the output signal of the corresponding power amplifier.

A typical calibration procedure is initiated by operating the switch arrangement 835 to insert the reference signal into the feedback path. The switch arrangement 845 forwards the transferred reference signal to the coefficient calibrator 840, which then determines an appropriate complex gain calibration coefficient for phase and gain calibration.

Preferably, the phase shift for the phase calibration is selected arbitrarily so that the feedback path is given a fixed phase shift anywhere between −180° and 180°. In practice, His means that a phase detector incorporated in the coefficient calibrator measures the phase of the reference signal. The result of the phase measurement is compared to the nominal phase of the reference signal in order to determine the phase shift experienced by the reference signal over the feedback path. The calibrator then sets the complex gain coefficient so that the complex multiplier, or a conventional phase adjuster, adjusts the phase shift of the feedback path towards the selected phase shift.

Once the feedback path has been calibrated, the switch arrangement 835 switches the output signal of the first transmission branch to the calibrated feedback path. The parameter adaptation of the first transmission branch makes sure that the phase shift of the transmission branch is opposite and equal to that of the calibrated feedback path and that the gain of the transmission branch is properly adjusted. Now, the switch arrangement 835 switches the output signal of the next transmission branch into the feedback path, and the corresponding parameter adaptation adjusts the phase shift and gain of the transmission branch. The procedure continues until all transmission branches have the same calibrated phase shift and gain, thus ensuring that the desired phase and amplitude relationship between the transmission signals of the different branches can be accurately maintained.

Figure 9:
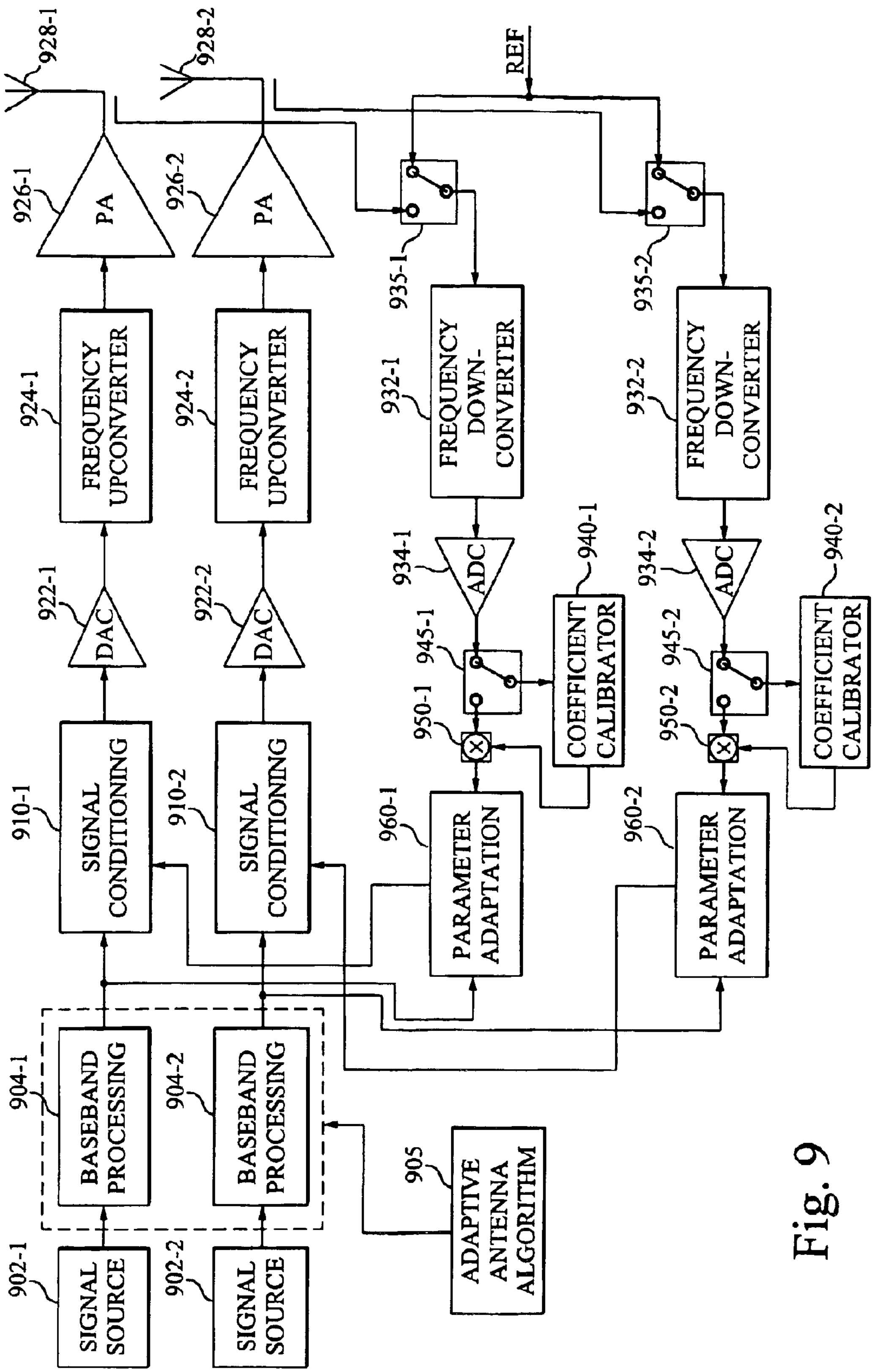
FIG. 9 is a schematic block diagram illustrating an adaptive antenna system according to an alternative embodiment of the invention.

FIG. 9 is a schematic block diagram illustrating an adaptive antenna system according to an alternative embodiment of the invention. The adaptive antenna system of FIG. 9 is similar to that of FIG. 8, except that now each transmission branch (only two branches are illustrated) is associated with its own dedicated feedback path and parameter adaptation block. This means that the first transmission branch defined by signal source 902-1, baseband processing block 904-1, signal conditioning block 910-1, DAC 922-1, up-converter 924-1, amplifier 926-1 has its own feedback path, defined by switch 935-1, down-converter 932-1, ADC 934-1, switch 945-1, coefficient calibrator 940-1 and complex multiplier 950-1, leading to the parameter adaptation block 960-1. Similarly, the second transmission branch defined by signal source 902-2, baseband processing block 904-2, signal conditioning block 910-2, DAC 922-2, up-converter 924-2, amplifier 926-2 has its own feedback path, defined by switch 935-2, down-converter 932-2, ADC 934-2, switch 945-2, coefficient calibrator 940-2 and complex multiplier 950-2, leading to the parameter adaptation block 960-2. With this kind of arrangement, it is beneficial if all feedback paths are calibrated to the same absolute phase and/or gain using the same reference signal.

Implementation in a Transmit Diversity System

For a transmit diversity system used in a mobile communication system such as WCDMA (Wideband Code Division Multiple Access), the downlink signal is often transmitted via two or more base station antenna transmission branches, utilizing either space or polarization diversity.

The performance gain from transmit diversity, generally reflected as improved downlink capacity, can be subdivided into coherent combining gain and diversity gain against fast fading. The coherent combining gain is obtained because the signals transmitted by the antenna branches are combined coherently, while interference is combined non-coherently. The gain from ideal coherent combining is 3 dB with two antennas. Transmit diversity also provides gain against fast fading. This gain is larger when there is less multipath diversity. In this respect, it is important to note the difference between multipath diversity and transit diversity. In CDMA, multipath diversity reduces the orthogonality of the downlink codes, while transmit diversity keeps the downlink codes orthogonal in flat fading channels. In order to maximize the interference-limited downlink capacity, it would be beneficial to avoid multipath propagation to keep the codes orthogonal and to provide diversity with transmit antenna diversity. The transmit diversity gain can alternatively be used to improve the downlink coverage, while keeping the load unchanged.

The antenna branches used in a transmit diversity system have strict requirements on the delay matching. If these requirements are not satisfactorily fulfilled, the capacity gain achieved by the transmit diversity could be lost, or worse it could actually degrade the system capacity.

Figure 10:
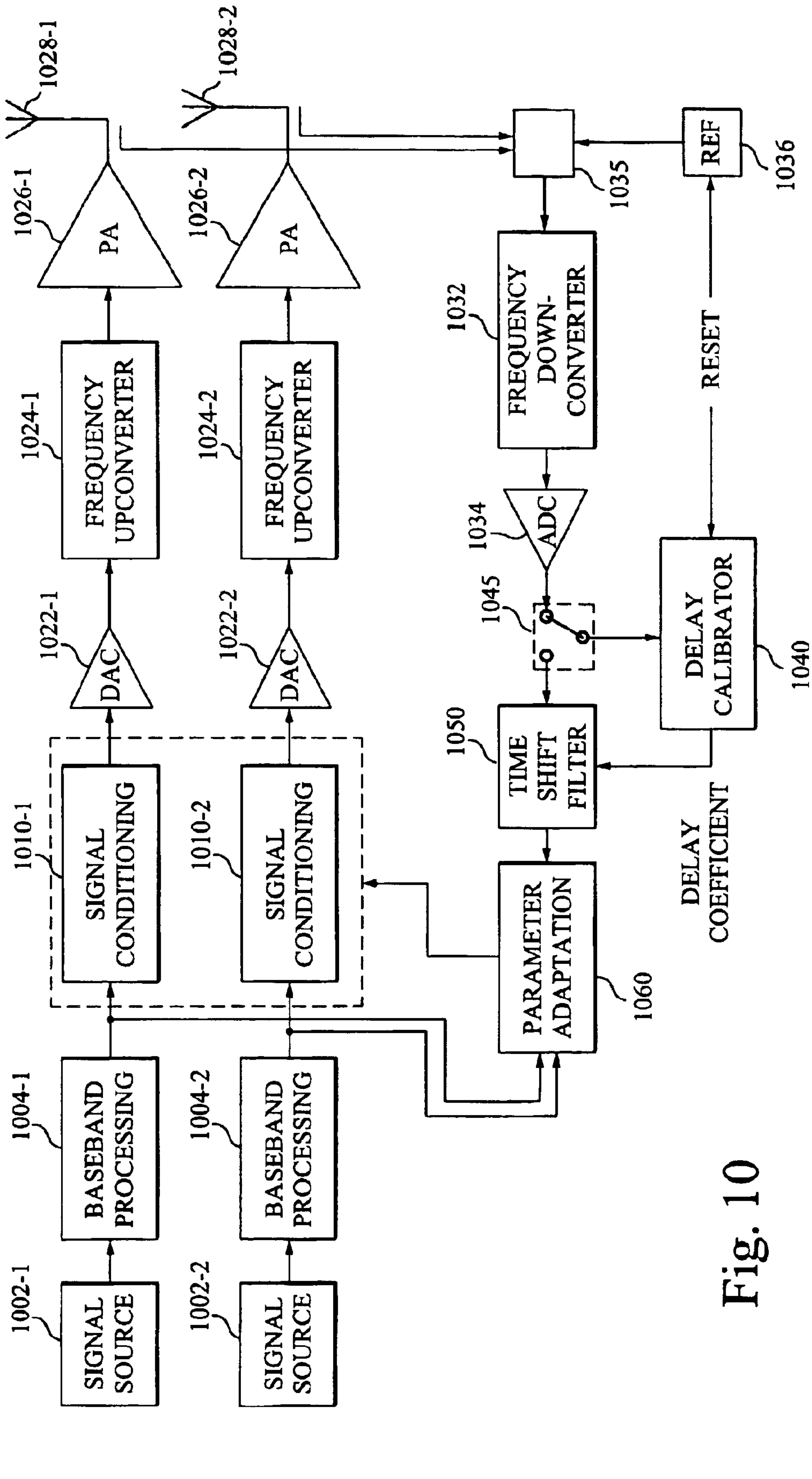
FIG. 10 is a schematic block diagram illustrating a transmit diversity system according to a preferred embodiment of the invention.

FIG. 10 is a schematic block diagram illustrating a transmit diversity system according to a preferred embodiment of the invention. The transmit diversity system of FIG. 10 basically comprises two (or more) antenna transmission branches. In this example, each antenna transmission branch includes a signal source 1002, a baseband processing block 1004, a signal conditioning block 1010, a digital-to-analog converter 1022, a frequency up-converter 1024 and a power amplifier 1026 connected to an antenna element 1028. The signal conditioning block 1010 now includes a time shift filter, and the corresponding parameter adaptation has to determine the necessary delay adjustment for the transmission branch. In this particular example, the transmission branches share the same feedback path. A switch arrangement 1035 is provided for alternately connecting the different transmission branches to the feedback path, or for selectively switching a reference signal from a reference signal generator 1036 into the feedback path. The feedback path basically comprises a frequency down-converter 1032 and an ADC 1034. The output of the ADC 1034 is connected to a further switch 1045, which selectively forwards the digital output signal of the ADC 1034 either to a delay calibrator 1040 or a time shift filter 1050. The time shift filter 1050 is connected to a parameter adaptation block 1060 for providing a delay-calibrated representation of the output signal of the respective power amplifier to the adaptation block. In the case of delay calibration, the parameter adaptation is primarily performed for adjusting the delay of the transmission signal of the respective transmission branch in the signal conditioning block 1010 to ensure accurate delay matching between the different transmission branches.

For delay calibration of the feedback path, the reference signal generator 1036 and the delay calibrator 1040 are synchronized in time by means of a reset signal so that they both work from the same time reference. It is also important that the reference signal contains information that makes it possible to differentiate time. For example, the reference signal may be provided as a band-limited spread spectrum signal that can be de-correlated in the delay calibrator 1040 to resolve the time delay of the feedback path. The calibrator 1040 calculates a delay correction coefficient and the time shift filter 1050 adjusts the delay of the feedback path to a known fixed time delay. This means that the absolute time delay of each transmission branch can be calculated.

Once the feedback path has been calibrated to a fixed delay, the switch arrangement 1035 alternately connects the different transmission branches to the calibrated feedback path. In this way, the delay of the different transmission branches can be accurately adjusted by the corresponding parameter adaptation such that the desired delay relationship between the transmission signals of the different branches is maintained.

Figure 11:
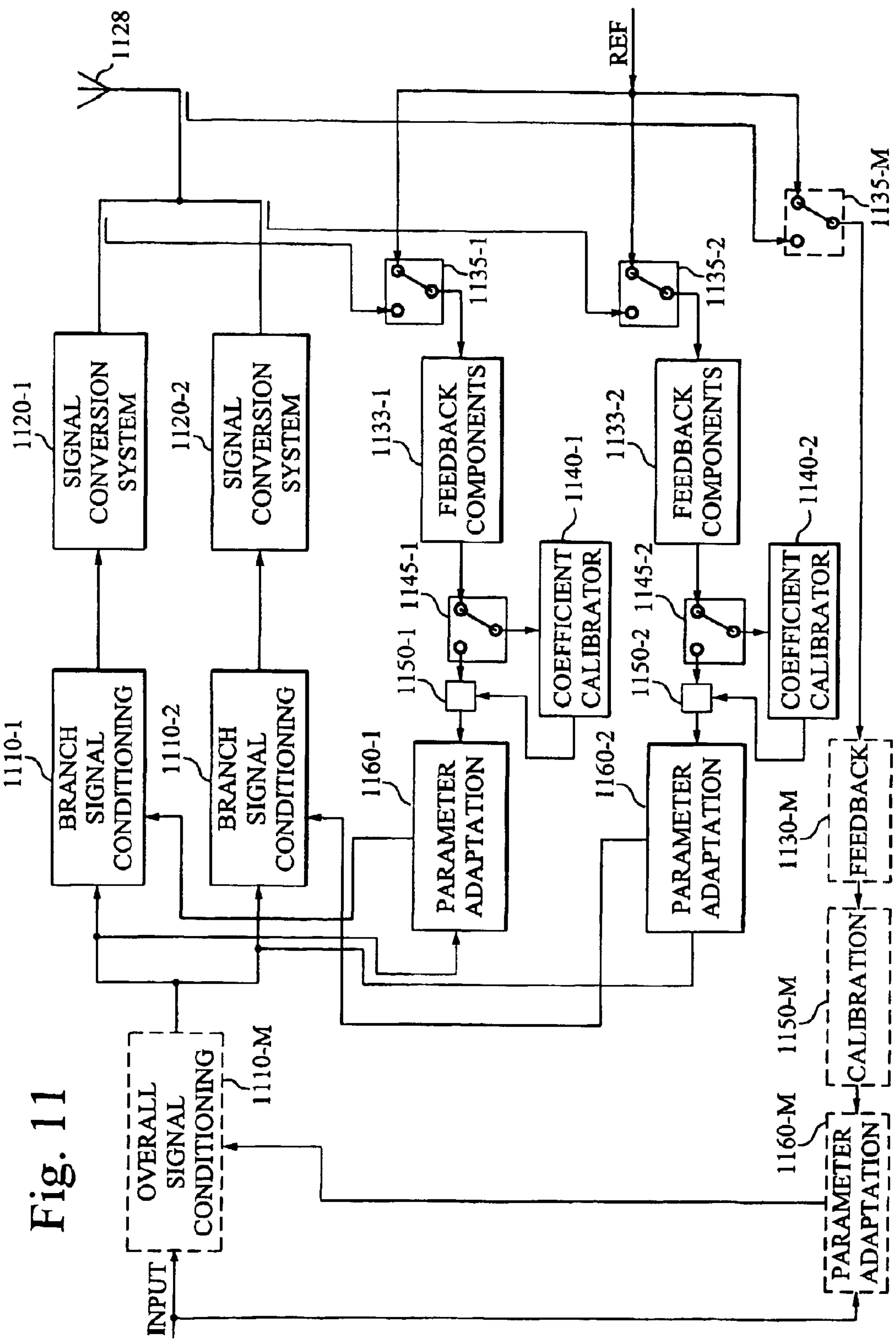
FIG. 11 illustrates yet another multi-branch transmitter system of the invention.

FIG. 11 is a schematic block diagram illustrating yet another multi-branch transmitter system according to the invention. Instead of having a single transmission branch for each antenna, as shown in FIGS. 8–10, two or more transmission branches are now combined to produce the output signal for transmission by an antenna. In this example, an input signal path is divided into two or more transmission branches, possibly after optional signal conditioning in the overall signal conditioning block 1110-M. Each individual transmission branch typically includes a branch signal conditioning block 1110 and signal conversion system 1120. The output signals of the different transmission branches are generally combined, either directly or over some type of output network (not shown), into a common signal for transmission by the antenna 1128. Each transmission branch is associated with a feedback path for enabling adaptation of the parameters used by the respective branch signal conditioning block. By selectively switching, using switch 1135, a reference signal into the feedback path, the feedback path may be calibrated by means of the further switch 1145, the coefficient calibrator 1140 and the compensator 1150, as described earlier. This allows more accurate adaptive signal conditioning, and better control of the gain, phase and/or delay relationship between the transmission signals of the different transmission branches.

It is also possible to provide a feedback path for allowing adaptation of the parameters used by the overall signal conditioning block 1110-M, and calibrating this feedback path using the reference signal. In this case, the reference signal is inserted into the feedback path by the switch 1135-M, and transferred over the required feedback components 1130-M and calibrated in the calibration block 1150-M. The calibration block 1150-M generally comprises the same functional units 1140, 1145, 1150 as the calibration mechanism for each individual feedback path. This means that the parameter adaptation block 1160-M for the overall signal conditioning block 1110-M receives a calibrated feedback signal.

The architecture illustrated in FIG. 11 is particularly suitable for use with efficiency enhancement techniques such as Doherty, Chireix, EER (Envelope Elimination and Restoration), Bias Adaptation and other similar techniques for accurately controlling the gain, phase and or delay relationship between the different transmission branches in the system. For example, in the case of a Doherty-based system, one of the transmission branches includes the main amplifiers whereas the other transmission branch includes an auxiliary amplifier and the output signals of the different transmission branches are combined over a Doherty output network. Detailed information on efficiency enhancement techniques in connection with RF power amplifiers can be found, for example in reference [15]. Although the techniques are not explicitly shown as adaptive in reference [15], the extension from non-adaptive to adaptive efficiency enhancement techniques is quite straightforward in view of the present disclosure.

The embodiments described above are merely given as examples, and it should be understood that the present invention is not limited thereto. For example, various hybrids of the illustrated embodiments can be realized. Further modifications, changes and improvements which retain the basic underlying principles disclosed and claimed herein are within the scope and spirit of the invention.

REFERENCES

[1] R. C. Davis and J. Grabowski, "An Experimental MQAM Modem Using Amplifier Linearization and Baseband Equalization Techniques", Proc. Natl. Commun. Conf., pp. E3.2.1–E3.2.6, 1982.
[2] U.S. Pat. No. 4,291,277.
[3] U.S. Pat. No. 5,483,681.
[4] U.S. Pat. No. 5,937.011.
[5] U.S. Pat. No. 5,909,642.
[6] U.S. Pat. No. 6,072,364.
[7] U.S. Pat. No. 6,141,390.
[8] International Patent Application WO 97/49174.
[9] European Patent Application No. 1,047,185.
[10] U.S. Pat. No. 4,462,001.
[11] U.S. Pat. No. 4,700,151.
[12] U.S. Pat. No. 5,049,832.
[13] X. Vuong, H. Moody, "Realization of Predistortion Compensators of Memoryless Nonlinear Devices", Spar Aerospace, 1980.
[14] Saleh, Salz, "Adaptive Linearization of Power Amplifiers", Bell Journal, Bell Labs, April 1983.
[15] S. C. Cripps, "RF Power Amplifiers for Wireless Communications", Artech House, 1999, pp. 219–250.

What is claimed is:

1. An adaptive signal conditioning system comprising:

a signal conditioner in the signal path to a signal conversion system;

a feedback path responsive to the output signal of said signal conversion system to enable adaptation of parameters used by the signal conditioner;

means for selectively inserting a reference signal into said feedback path;

means for calibrating said feedback path based on said reference signal.

2. The adaptive signal conditioning system according to claim 1, wherein said calibrating means calibrates said feedback path with respect to at least one of gain, phase shift and delay.

3. The adaptive signal conditioning system according to claim 1, wherein said reference signal inserting means comprises means for selectively switching the reference signal into said feedback path instead of the output signal of said signal conversion system.

4. The adaptive signal conditioning system according to claim 1, wherein said calibrating means comprises means for compensating for changes in transfer characteristics of said feedback path based on measurements of changes in signal characteristics of said reference signal over said feedback path.

5. The adaptive signal conditioning system according to claim 4, wherein the signal characteristics include at least one of signal level, signal phase and signal delay.

6. The adaptive signal conditioning system according to claim 1, wherein said calibrating means comprises:

means for measuring signal characteristics at the output of said feedback path in response to said inserted reference signal;

means for determining a correction coefficient set based on the measured signal characteristics and nominal signal characteristics of said inserted reference signal;

means for calibrating said feedback path based on said correction coefficient set.

7. The adaptive signal conditioning system according to claim 6, wherein said signal conditioning system further comprises means for maintaining the nominal signal characteristics of said inserted reference signal based on pre-characterization of the reference signal characteristics with respect to at least one of the variables temperature, frequency and time.

8. The adaptive signal conditioning system according to claim 6, wherein said signal conditioning system further comprises means for maintaining the nominal signal characteristics of said reference signal based on direct measurements of the signal characteristics of the reference signal.

9. The adaptive signal conditioning system according to claim 1, wherein said signal conversion system includes a power amplifier.

10. The adaptive signal conditioning system according to claim 1, wherein said signal conditioning system comprises multiple signal conditioners, each of which is provided in the signal path to a respective signal conversion system, each one of said signal conditioners being associated with a reference-signal-calibrated feedback path from the output of the respective signal conversion system to enable adaptation of parameters used by the signal conditioner.

11. The adaptive signal conditioning system according to claim 1, wherein said feedback path extends from the output of said signal conversion system to a parameter adaptation block, and said parameter adaptation block is operable for adapting the signal conditioner parameters in response to a feedback signal transferred over the calibrated feedback path and an input signal representation.

12. The adaptive signal conditioning system according to claim 1, wherein said reference signal comprises multiple signal components.

13. A calibration method for an adaptive signal conditioning system having a signal conditioner provided in the signal path to a signal conversion system, and a feedback path responsive to the output signal of the signal conversion system to enable adaptation of parameters used by the signal conditioner, wherein said method comprises the steps of:

selectively inserting a reference signal into said feedback path; and calibrating said feedback path based on said reference signal.

14. The calibration method according to claim 13, wherein said feedback path is calibrated with respect to at least one of gain, phase shift and delay.

15. The calibration method according to claim 13, wherein said reference signal inserting step comprises the step of selectively switching the reference signal into said feedback path instead of the output signal of said signal conversion system.

16. The calibration method according to claim 13, wherein said calibrating step comprises the step of compensating for changes in transfer characteristics of said feedback path based on measurements of changes in signal characteristics of said reference signal over said feedback path.

17. The calibration method according to claim 16, wherein the signal characteristics include at least one of signal level, signal phase and signal delay.

18. The calibration method according to claim 13, wherein said calibrating step comprises the steps of:

measuring signal characteristics at the output of said feedback path in response to said inserted reference signal;

determining a correction coefficient set based on the measured signal characteristics and nominal signal characteristics of said inserted reference signal;

calibrating said feedback path based on said correction coefficient set.

19. The calibration method according to claim 18, wherein said calibration method further comprises the step of maintaining the nominal signal characteristics of said inserted reference signal based on pre-characterization of the reference signal characteristics with respect to at least one of the variables temperature and frequency.

20. The calibration method according to claim 18, wherein said calibration method further comprises the step of maintaining the nominal signal characteristics of said reference signal based on direct measurements of the signal characteristics of the reference signal.

21. The calibration method according to claim 13, wherein said signal conversion system includes a power amplifier.

22. A power amplifier system comprising:

a power amplifier;

a predistorter provided in the signal path to the power amplifier;

a feedback path responsive to the output signal of the power amplifier to enable adaptation of parameters used by the predistorter;

means for selectively inserting a reference signal into said feedback path;

means for calibrating said feedback path with respect to at least one of gain and phase shift based on said reference signal.

23. The power amplifier system according to claim 22, wherein said reference signal inserting means comprises means for selectively switching the reference signal into said feedback path instead of the power amplifier output signal.

24. The power amplifier system according to claim 22, wherein said calibrating means comprises means for compensating for changes in at least one of feedback gain and feedback phase shift based on measurements of changes in the corresponding signal characteristics of said reference signal over said feedback path.

25. The power amplifier system according to claim 22, wherein said calibrating means comprises:

means for measuring at least one of signal level and signal phase at the output of said feedback path in response to said inserted reference signal;

means for determining a correction coefficient set based on the measured signal level/phase and the known signal level/phase of said inserted reference signal;

means for correcting the gain/phase shift of said feedback path based on said correction coefficient set.

26. The power amplifier system according to claim 25, wherein said power amplifier system further comprises means for maintaining known signal characteristics of said inserted reference signal based on pre-characterization of reference signal characteristics with respect to at least one of the variables temperature and frequency.

27. The power amplifier system according to claim 25, wherein said power amplifier system further comprises means for maintaining the known signal characteristics of said reference signal based on direct measurements of signal characteristics of the reference signal.

28. The power amplifier system according to claim 22, wherein said calibrating means calibrates said feedback path with respect to gain for enabling adaptation of the predistorter parameters with respect to signal level such that the output power accuracy of the power amplifier system is maintained.

29. The power amplifier system according to claim 22, wherein said feedback path extends from the output of said power amplifier to a parameter adaptation block, and said parameter adaptation block is operable for adapting the predistorter parameters in response to a feedback signal transferred over the calibrated feedback path and an input signal representation.

30. A transmitter system comprising:

multiple signal transmission branches, each of which includes a signal conditioner;

at least one feedback path responsive to the output signal of at least one transmission branch to enable adaptation of parameters used by the corresponding signal conditioner;

means for selectively inserting a reference signal into said at least one feedback path; and means for calibrating said at least one feedback path based on said reference signal.

31. The transmitter system according to claim 30, wherein said transmission branches alternately share a common feedback path, with a feedback connection from the output of each transmission branch to said common feedback path, and said reference signal is inserted into said common feedback path for calibration thereof.

32. The transmitter system according to claim 30, wherein each transmission branch is associated with its own feedback path, and all feedback paths are calibrated using the same reference signal.

33. The transmitter system according to claim 30, wherein said calibrating means comprises means for compensating for changes in transfer characteristics of said feedback path based on measurements of changes in signal characteristics of said reference signal over said feedback.

34. The transmitter system according to claim 30, wherein said transmitter system is an adaptive antenna system, and said calibrating means calibrates said at least one feedback path with respect to at least one of gain and phase shift.

35. The transmitter system according to claim 30, wherein said transmitter system is a transmit diversity system, and said calibrating means calibrates said at least one feedback path with respect to delay for enabling adaptation of the parameters used by the signal conditioners in the transmission branches such that the accuracy of the delay matching between the transmission branches is maintained.

36. The transmitter system according to claim 30, wherein each of said transmission branches comprises a power amplifier in the input signal path to an antenna.

37. The transmitter system according to claim 30, wherein each of said transmission branches is associated with its own antenna.

38. The transmitter system according to claim 30, wherein a number of said transmission branches are combined to produce an output signal for transmission by an antenna.

* * * * *